US008717536B2

(12) United States Patent
Menchtchikov et al.

(10) Patent No.: US 8,717,536 B2
(45) Date of Patent: May 6, 2014

(54) LITHOGRAPHIC APPARATUS, DEVICE MANUFACTURING METHOD AND ASSOCIATED DATA PROCESSING APPARATUS AND COMPUTER PROGRAM PRODUCT

(75) Inventors: Boris Menchtchikov, Eindhoven (NL); Alexander Viktorovych Padiy, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 345 days.

(21) Appl. No.: 13/009,250

(22) Filed: Jan. 19, 2011

(65) Prior Publication Data

US 2011/0216294 A1    Sep. 8, 2011

Related U.S. Application Data

(60) Provisional application No. 61/306,045, filed on Feb. 19, 2010.

(51) Int. Cl.
  *G03B 27/42*   (2006.01)
  *G03B 27/54*   (2006.01)
  *G03B 27/52*   (2006.01)
  *G03F 7/20*    (2006.01)

(52) U.S. Cl.
  CPC ........ *G03F 7/70258* (2013.01); *G03F 7/70616* (2013.01)
  USPC .................................. 355/53; 355/67; 355/55

(58) Field of Classification Search
  USPC .......................... 355/52, 53, 55, 67; 250/548; 356/399–401
  See application file for complete search history.

(56) References Cited

U.S. PATENT DOCUMENTS

| | | | |
|---|---|---|---|
| 5,945,239 A | 8/1999 | Taniguchi | |
| 6,235,438 B1 | 5/2001 | Suzuki et al. | |

(Continued)

FOREIGN PATENT DOCUMENTS

| | | |
|---|---|---|
| JP | 06-310399 A | 11/1994 |
| JP | 07-183214 A | 7/1995 |
| JP | 11-219900 A | 8/1999 |

OTHER PUBLICATIONS

International Preliminary Report on Patentability and Written Opinion of the International Searching Authority directed to related International Patent Application No. PCT/EP2011/050324, mailed Aug. 21, 2012, from the International Bureau of WIPO; 7 pages.

(Continued)

*Primary Examiner* — Hung Henry Nguyen
(74) *Attorney, Agent, or Firm* — Sterne, Kessler, Goldstein & Fox P.L.L.C.

(57) ABSTRACT

A lithographic apparatus operates by moving a substrate and a patterning device relative to each other in a sequence of movements such that a pattern is applied at a successive portions on the substrate. Each portion of the substrate is patterned by a scanning operation in which the patterning device is scanned through the radiation beam while synchronously scanning the substrate through the patterned radiation beam so as to apply the pattern to the desired portion on the substrate. An intrafield correction is applied during each scanning operation so as to compensate for distortion effects which vary during the scanning operation. The intrafield correction includes corrective variations of one or more properties of the projection system, and optionally out-of-plane movements of the patterning device and/or substrate table.

15 Claims, 5 Drawing Sheets

(56) References Cited

U.S. PATENT DOCUMENTS

| | | | |
|---|---|---|---|
| 6,359,678 B1 | 3/2002 | Ota | |
| 6,522,390 B2* | 2/2003 | Suzuki et al. | 355/53 |
| 6,753,948 B2 | 6/2004 | Taniguchi | |
| 7,848,594 B2* | 12/2010 | Yoshikawa | 382/286 |
| 7,965,387 B2* | 6/2011 | Hagiwara | 356/237.5 |
| 8,125,613 B2* | 2/2012 | Suzuki | 355/53 |
| 2003/0035090 A1* | 2/2003 | Imai et al. | 355/53 |
| 2008/0165332 A1 | 7/2008 | Mos et al. | |

OTHER PUBLICATIONS

International Search Report directed to related International Application No. PCT/EP2011/050324, mailed Jul. 26, 2011 from the International Searching Authority, European Patent Office, Rijswijk, The Netherlands; 5 pages.

English-Language Abstract for Japanese Patent Publication No. 07-183214 A, published Jul. 21, 1995; 1 page.

* cited by examiner

LITHOGRAPHIC APPARATUS, DEVICE MANUFACTURING METHOD AND ASSOCIATED DATA PROCESSING APPARATUS AND COMPUTER PROGRAM PRODUCT

CROSS REFERENCE TO RELATED APPLICATIONS

This application claims benefit under 35 U.S.C. §119(e) to U.S. Provisional Patent Application No. 61/306,045, filed Feb. 19, 2010, which is incorporated by reference herein in its entirety.

BACKGROUND

1. Field of the Invention

The present invention relates to a lithographic apparatus and in particular to a method for testing a lithographic apparatus to measure and/or analyze, and to data processing apparatuses and computer program products for implementing parts of such a test method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti parallel to this direction.

In order to monitor the lithographic process, it is necessary to measure parameters of the patterned substrate, for example the overlay error between successive layers formed in or on it and critical line width in a developed metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In order to better control scanner functionality, a module has been recently devised which automatically drives the system towards a pre-defined baseline each day. This scanner stability module retrieves standard measurements taken from a monitor wafer using a metrology tool. The monitor wafer had been previously exposed using a special reticle containing special scatterometry marks. Using the monitor wafer and that day's measurements (and possibly the historical measurement data from the previous days), the scanner stability module determines how far the system has drifted from its baseline, and then calculates wafer-level overlay and focus correction sets. The baseline can be defined either directly by the reference layer on the monitor wafers (in this case baseliner will drive the system towards minimal overlay on the baseliner monitor wafers) or indirectly by a combination of the reference layer on the wafers and the target overlay fingerprint (in this case baseliner will drive the system towards defined target overlay fingerprint on the baseliner monitor wafers). The lithography system then converts these correction sets into specific corrections for each exposure on subsequent production wafers.

While known systems provide correction of patterning performance characteristics between different apparatuses and between different parts of a substrate within an apparatus, the known techniques do not address variation within the scanning period in a scanner-type lithographic apparatus. Due to dynamic effects such as radiation heating of the patterning device, a projection lens or the substrate, distortion of the image can actually vary during the course of a scan. Although these variations are systematic and therefore predictable at least to some extent, current systems must simply accommodate this variation within their average performance criteria.

SUMMARY

Therefore, what is needed is an effective system and method to enable improved performance of lithographic apparatus including the correction of patterning performance characteristics within the scanning period in a scanner-type lithographic apparatus.

In an embodiment of the present invention, there is provided a scanning-type lithographic apparatus wherein, regarding the patterning device, the projection system and the substrate together as an optical system having an optical axis defining a vertical direction and having the patterning device and substrate arranged nominally in respective horizontal planes, the control system is arranged to compensate for intrafield distortions occurring in the optical system by corrective movements of one or more elements of the optical system during each scanning operation. In addition, the corrective movements include out-of-plane movements so as to correct for intrafield in-plane distortion effects that cannot be corrected by only in-plane movements of the patterning device and substrate support.

In a further embodiment of the present invention, there is provided a device manufacturing method comprising projecting a patterned beam of radiation onto successive portions of a substrate, wherein an illumination system conditions a radiation beam, a support provides support to a patterning device, where the patterning device is capable of imparting the radiation beam with a pattern in its cross-section to form a patterned radiation beam. Further, a substrate table holds a substrate, and a projection system projects the patterned radiation beam onto a target portion of the substrate where each portion of the substrate is patterned by a field scanning operation in which the substrate table and the patterning device are moved relative to each other and to the projection system to so as to scan the patterning device through the radiation beam while synchronously scanning the substrate through the patterned radiation beam so as to apply the pattern to the desired portion on the substrate. The method continues where, regarding the patterning device, the projection system and the substrate together as an optical system that has an optical axis defining a vertical direction and where the patterning device and substrate are arranged nominally in respective horizontal planes, the positioning system is controlled to compensate for intrafield distortions occurring in the optical system by corrective movements of one or more elements of the optical system during each scanning operation, and where the corrective movements include out-of-plane movements so as to correct for intrafield in-plane distortion effects that cannot be corrected by only in-plane movements of the patterning device and substrate support.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

Figure 1:
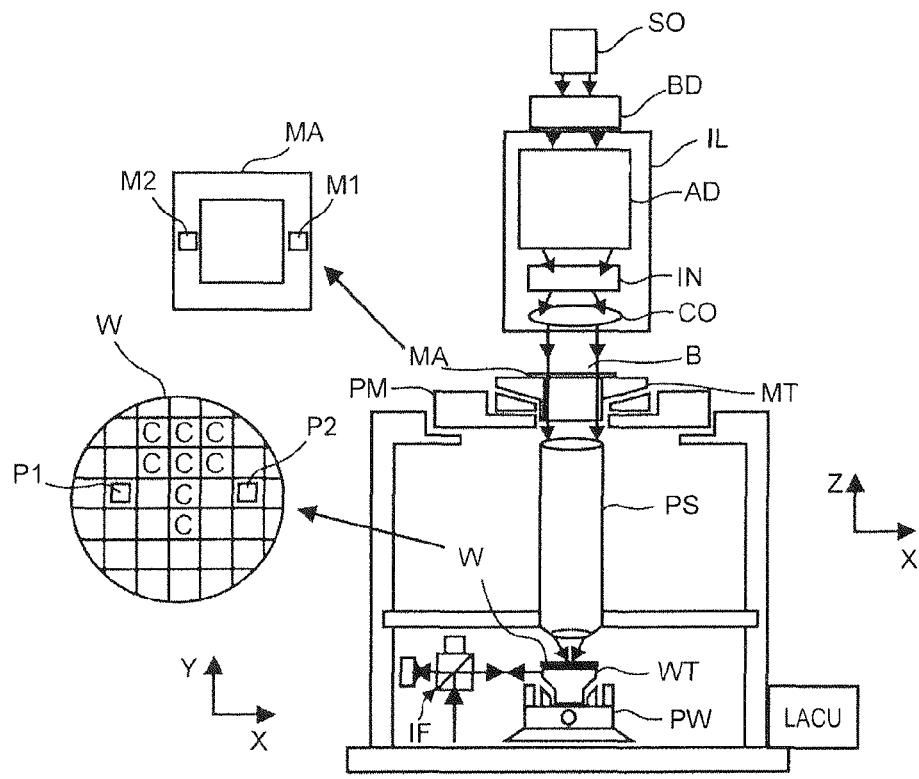
FIG. 1 depicts a lithographic apparatus, according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus includes an illumination system (illuminator) IL configured to condition a radiation beam B (e.g., UV radiation or EUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing various types of projection systems, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The apparatus further includes a lithography control unit LACU which controls all the movements and measurements of the various actuators and sensors described.

The lithographic apparatus may be of a type having two (dual stage) or more substrate tables and for example two or more mask tables. In such "multiple stage" machines the additional tables may be used in parallel, or preparatory steps may be carried out on one or more tables while one or more other tables are being used for exposure. The invention disclosed herein provides additional flexibility in both single- and multi-stage apparatuses.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2, and substrate alignment marks P1, P2. Although the substrate alignment marks as illustrated occupy dedicated target portions, they may be located in spaces between target portions, which are known as scribe-lane alignment marks. Similarly, in situations in which more than one die is provided on the mask MA, the mask alignment marks may be located between the dies.

In practice, control unit LACU will be realized as a system of many sub-units, each handling the real-time data acquisition, processing, and control of a subsystem or component within the apparatus. For example, one processing subsystem may be dedicated to servo control of the substrate positioner PW. Separate units may even handle coarse and fine actuators, or different axes. Another unit might be dedicated to readout of the position sensor IF. Overall control of the apparatus may be controlled by a central processing unit, communicating with these sub-systems processing units, with operators and with other apparatuses involved in the lithographic manufacturing process.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. In an embodiment, the correction mechanism is associated with exposures performed with scanning movements, as in mode 2 and 3 mentioned above.

Figure 2:
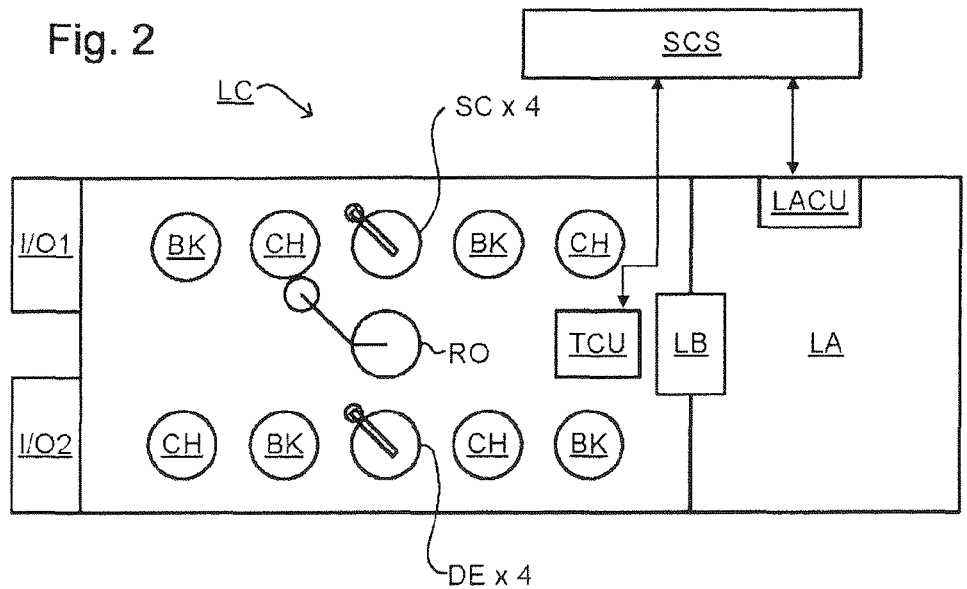
FIG. 2 depicts a lithographic cell or cluster including the apparatus of FIG. 1, according to an embodiment of the present invention.

As shown in FIG. 2, according to an embodiment of the present invention, the lithographic apparatus LA forms part of a lithographic cell LC, also sometimes referred to as a 'lithocell' or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports O/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, may be made to exposures of subsequent substrates, especially if the inspection can be done soon and fast enough that other substrates of the same batch are still to be exposed. Also, already exposed substrates may be stripped and reworked to improve yield or to possibly be discarded, thereby avoiding performing exposures on substrates that are known to be faulty. In a case where only some target portions of a substrate are faulty, further exposures can be performed only on those target portions which are deemed to be non-faulty.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, as in, there is only a very small difference in refractive index between the parts of the resist which have been exposed to radiation and those which have not, and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image at which point either the exposed or unexposed parts of the resist have been removed or after a pattern transfer step such as etching. The latter possibility limits the possibilities for rework of faulty substrates but may still provide useful information.

A key component of accurate lithography is an ability to calibrate individual lithographic apparatus. In addition to general parameters affecting the whole substrate area, it is known to map and model the error 'fingerprint' of an individual apparatus across the substrate area. This fingerprint, which can be established in terms of focus, dose and/or alignment, can be used during exposure to correct the idiosyncrasies of that apparatus, and thereby achieve a more accurate patterning.

Improvements to the apparatus's focus and overlay (layer-to-layer alignment) uniformity have recently been achieved by the applicant's Baseliner™ scanner stability module, leading to an optimized process window for a given feature size and chip application, enabling the continuation the creation of smaller, more advanced chips. The scanner stability module in a preferred embodiment automatically resets the system to a pre-defined baseline each day. To do this it retrieves standard measurements taken from a monitor wafer using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

Figure 3:
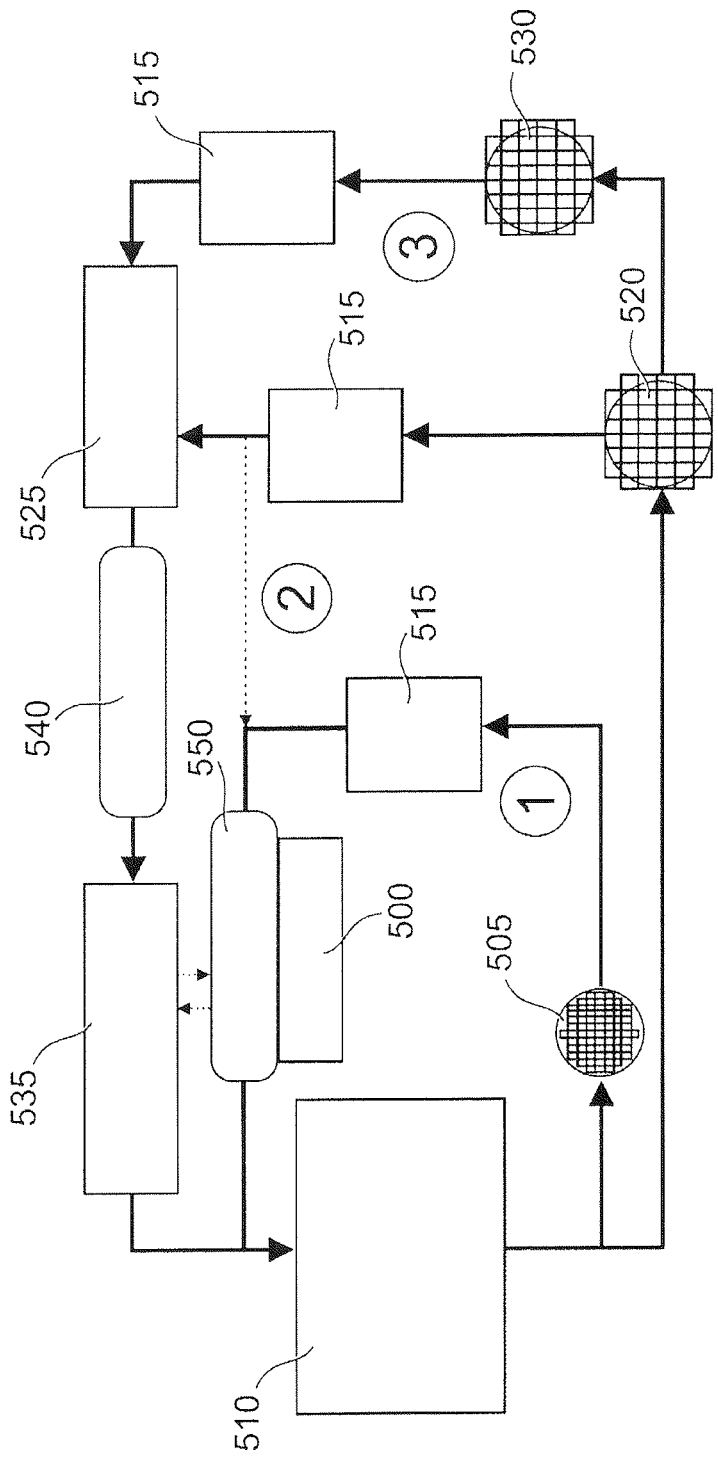
FIG. 3 is a schematic diagram of control mechanisms in a lithographic process utilizing a scanner stability module, according to an embodiment of the present invention.

FIG. 3, according to an embodiment of the present invention, depicts the overall lithography and metrology method incorporating the scanner stability module 500, for example, essentially an application running on a server. Shown are three main process control loops. The first loop provides the local scanner control using the scanner stability module 500 and monitor wafers. The monitor wafer 505 is shown being passed from the main lithography unit 510, having been exposed to set the baseline parameters for focus and overlay. At a later tine, metrology unit 515 reads these baseline parameters, which are then interpreted by the scanner stability module 500 so as to calculate correction routines so as to provide scanner feedback 550, which is passed to the main lithography unit 510, and used when performing further exposures.

The second (APC) loop is for local scanner control on-product (determining focus, dose, and overlay). The exposed product wafer 520 is passed to metrology unit 515 where information relating to the critical dimensions, sidewall angles, and overlay is determined and passed onto the Advanced Process Control (APC) module 525. This data is also passed to the scanner stability module 500. Process corrections 540 are made before the Manufacturing Execution System (MES) 535 takes over, providing scanner control to the main lithography unit 510, in communication with the scanner stability module 500.

The third loop is to allow metrology integration into the second APC loop (e.g., for double patterning). The post etched wafer 530 is passed to metrology unit 515 which again passes information relating to the critical dimensions, sidewall angles and overlay, read from the wafer, to the Advanced Process Control (APC) module. The loop continues the same as with the second loop.

Correction of Intrafield Errors

Figure 4:
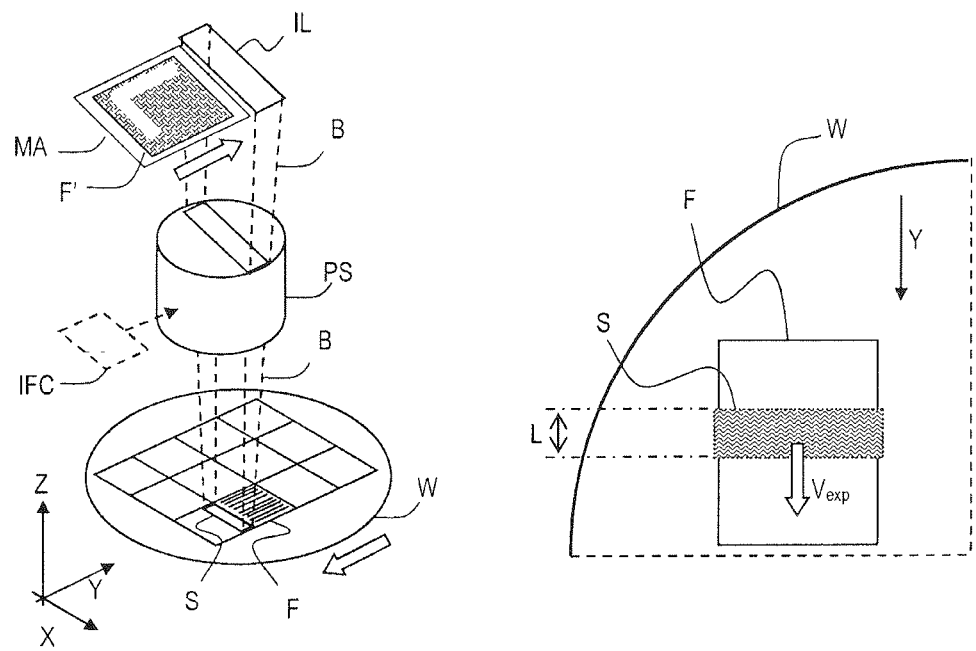
FIG. 4 illustrates schematically operation of the apparatus of FIG. 1 in exposing a target portion (field) on a substrate, according to an embodiment of the present invention.

FIG. 4, according to an embodiment of the present invention, illustrates schematically the scanning operation to expose one field F on a substrate W in the lithographic apparatus of FIG. 1. The substrate W and mask MA are seen in perspective view, with the illumination source IL above and the projection system PS in between. Mask MA carries a transparent pattern F' which is a scaled up version of the pattern to be applied to one field F on substrate W. Illumination source IL presents a slit of radiation S', not large enough in the Y direction to cover the area F' but wide enough in the X direction. To expose the entire field, the mask MA is moved through the area of slit S' to project a corresponding slit area S on substrate field F. These movements are represented by large arrows.

Conceptually, it is sufficient to regard the substrate as staying still, while the patterned slit S passes over it in the opposite sense of the Y direction, as shown by the schematic plan detail to the right of the diagram. The slit with length L is moved with an exposure velocity Vexp over field F.

In accordance with the calibration results and measurements discussed above, parameters of the projection system PS and control setpoints are adjusted prior to exposure to ensure that distortion within the slit is constant over the whole exposure. While the calibration and correction methods discussed above can compensate for relatively static errors and distortions in the lithographic process, the inventors have recognized also that accuracy of overlay in a scanning type of lithographic apparatus can be limited by dynamic effects within the period of each field exposure. Certain parameters, for example focus, are controlled dynamically throughout the scanning movement, to maintain optimum, uniform patterning quality across the field. Other dynamic errors, such as intrafield variations in distortion, are not specifically addressed in current mechanisms.

Figure 5A:
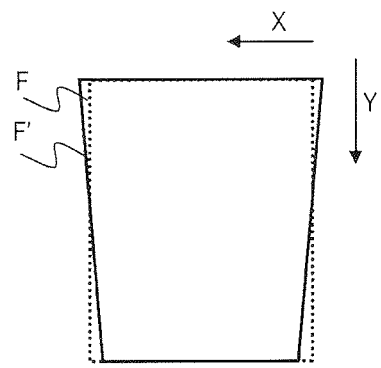
FIGS. 5a and 5b illustrates two types of intrafield distortion which can arise in a lithographic process, according to an embodiment of the present invention.
Figure 5B:
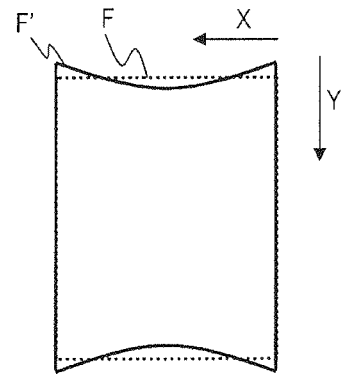

Two types of intrafield distortion are illustrated in FIGS. 5 (*a*) and (*b*), according to an embodiment of the present invention. Each drawing shows a distorted field F' compared with the ideal rectangular field F (dotted). Distortion in this context refers to a deviation within a slit from the nominal value which could not be corrected by dynamically adjusting offset and rotation (horizontal move) of the reticle and wafer stage. If this distortion varies during the scan, overlay accuracy will vary between different places within the field F. In this case, it will not be possible to fully correct for such effect by statically adjusted lens. The situation shown in (a) arises where distortion in the X direction varies during the scan (varies in the Y direction). The situation shown in (b) represents a non-linear distortion in the Y direction which also varies during the scan. Some types of intrafield distortion in the X-Y plane can be corrected by known techniques such as intrafield high order process correction, but the types just mentioned are examples of distortions which cannot. In a real apparatus, there will be a combination of several types of distortion, only some of which can be corrected by known techniques or by existing means.

These intrafield distortions may have various causes. As one example, the dynamic heating effect of the imaging radiation on the reticle and/or the substrate can cause local dimensional variation in one or both directions, between the beginning and end of a scan. Where the reticle MA expands more than the substrate W, the pattern formed on the substrate may be enlarged compared to an ideal pattern. If the substrate were to expand more than the reticle, the pattern formed would be reduced compared to the ideal. Heating within the projection system PS could also lead to distortions. The skilled reader will understand that reticle and wafer heating effects are referred to here merely as examples from which this distortion can arise. Of course, there could be other sources of this distortion as well (e.g., reticle clamping and lens movement etc.). The corrective mechanism described herein is able to correct for these effects independently of the root cause.

In order to enhance correction of these intrafield distortions and obtain more uniform performance across each field F, it is proposed here to impose an additional movement on one or more optical elements in the projection system PS, so as to alter its imaging properties during the scanning movement. To illustrate this, an intrafield correction function ICF influencing the projection system is shown schematically in FIG. 4. This function represents the modification of the projection system behavior under the influence of the control unit LACU. The modification could be implemented by the imposition of additional, variable optical elements specifically for the intrafield correction function. Alternatively, the intrafield correction function is implemented by suitable modification of existing control functions. In a practical apparatus, many parameters of the optical system will be set and adjusted by actuators under control of the unit LACU and its subsystems, to implement the functions dictated by the manufacturing execution system MES. By modifying the programming of the unit LACU to perform additional movements, or modified movements, during the scanning operation, the intrafield correction function can be implemented to reduce intrafield distortions. Actuators in known projection systems may provide for adjustment between scans, but not dynamic movements during an actual scan. The actuators in that case may also need modifying before the novel technique can be applied. If the control system is already able to provide intrafield control of the optical elements, the enhanced corrections can be implemented just by reprogramming the control system.

Different optical elements can be moved to correct the different types of distortion, for example, such as are illustrated in FIGS. 5 (*a*) and (*b*). Alternatively the same elements may be moved in different ways to achieve the various desired effects. The intrafield correction may be described in the control system at the level of individual elements, or it may be preferred to specify that certain global setpoints of the projection system, such as magnification in one or other dimension, should vary during the exposure. In the latter case, the corrective movements may be expressed in terms of Mag(X) as a function of Y. Then, a control system of the projection system PS will decide which of the actuators to use in order to compensate for this effect.

Corrections may also be achieved by combining movements within the projection system with movements of the reticle (patterning device M) and/or the substrate (wafer stage WS) as we might introduce by moving of the lens elements other side effects which are easier to correct. By providing control of many degrees of freedom, the intrafield correction can be achieved without introducing other distortions as aside-effect. It is proposed also to apply modifications in the movement profile of the reticle stage. In particular, setpoints for control of the reticle orientation and position in one or more axes can be programmed so as to vary with Y position within the scan. The known intrafield high order process correction employs only in-plane movements that are movements in the X-Y plane (X, Y. Rz). The inventors have recognized that additional intrafield distortions can be corrected by imposing modified out-of-plane movements during the scanning operation. Out-of-plane movements in this context mean movements having a vertical component, such as Z, Rx and Ry movements.

Adjusting vertical movement profile (in Z, Rx and Ry) of the reticle and wafer stage during the scan can change effective horizontal distortion with respect to X at a given Y position in ways which could not be achieved by moving reticle and wafer stage only horizontally. Moreover, these movements can be used, in combination with intrafield movement of the element or elements within the projection system, to optimize performance across each field. The corrective movements can be applied in any or all vertical degrees of, freedom and optionally some or all of the horizontal degrees of freedom, not only at the reticle (patterning device) but also at the substrate table.

Where the terms 'height' and 'vertical' are used to refer to the Z-axis position of a component such as the reticle and/or the substrate, it should be understood that this is not referring necessarily to height in relation to Earth or gravity. Systems are possible in which one or both of these components are not horizontally mounted. 'Height' in that case should be understood as referring to any displacement generally perpendicular to the plane of the component, or displacement parallel to the optical axis of the projection system. The optical axis need not be a straight line, especially in systems with reflective optical elements. The meaning of the term 'vertical' can nevertheless be readily understood by the skilled reader.

In order to obtain the desired correction profiles or adjustments, a fingerprint of the intrafield distortion should be obtained by measurement of samples exposed by the apparatus, and/or by predictive modeling. Where reticle and/or substrate heating are suspected to cause intrafield errors, for example, software applications are known for modeling heating effects during a substrate exposure sequence, and for generating corrections to the exposure parameters to compensate for expansion and contraction of different portions of the apparatus, the reticle and the substrate at different times. These software applications can be extended to predict distortion variations within each scan, and so generate the modified movement profiles necessary to implement intrafield correction. Where the distortions are measured from actual samples, the resulting calculated corrections can be applied regardless of the error cause. Where modeling is used, of course each cause of intrafield distortion should be modeled and the combined error taken into account when corrections calculated. In a real system a mixture of measurement and predictive modeling will often be used.

The intrafield correction parameters may be identical between fields, or they may themselves be specific to a specific field position on the substrate, or to a specific type of field (up-scan, down-scan, edge field, non-edge field etc.). The corrective movements may be linear movements, specified by simple start and end values, or they may be higher order, according to the form of distortion and the accuracy of correction required.

In summary, the lithographic apparatus is controlled to correct intrafield distortion by imposing movements on one or more elements (for example, lenses) in the projection system during the scan such that horizontal distortion changes as well. The movement of the lens may be accompanied by (the patterning device or reticle is here considered as an element of an optical system, which also includes the projections system and the substrate).

Figure 6:
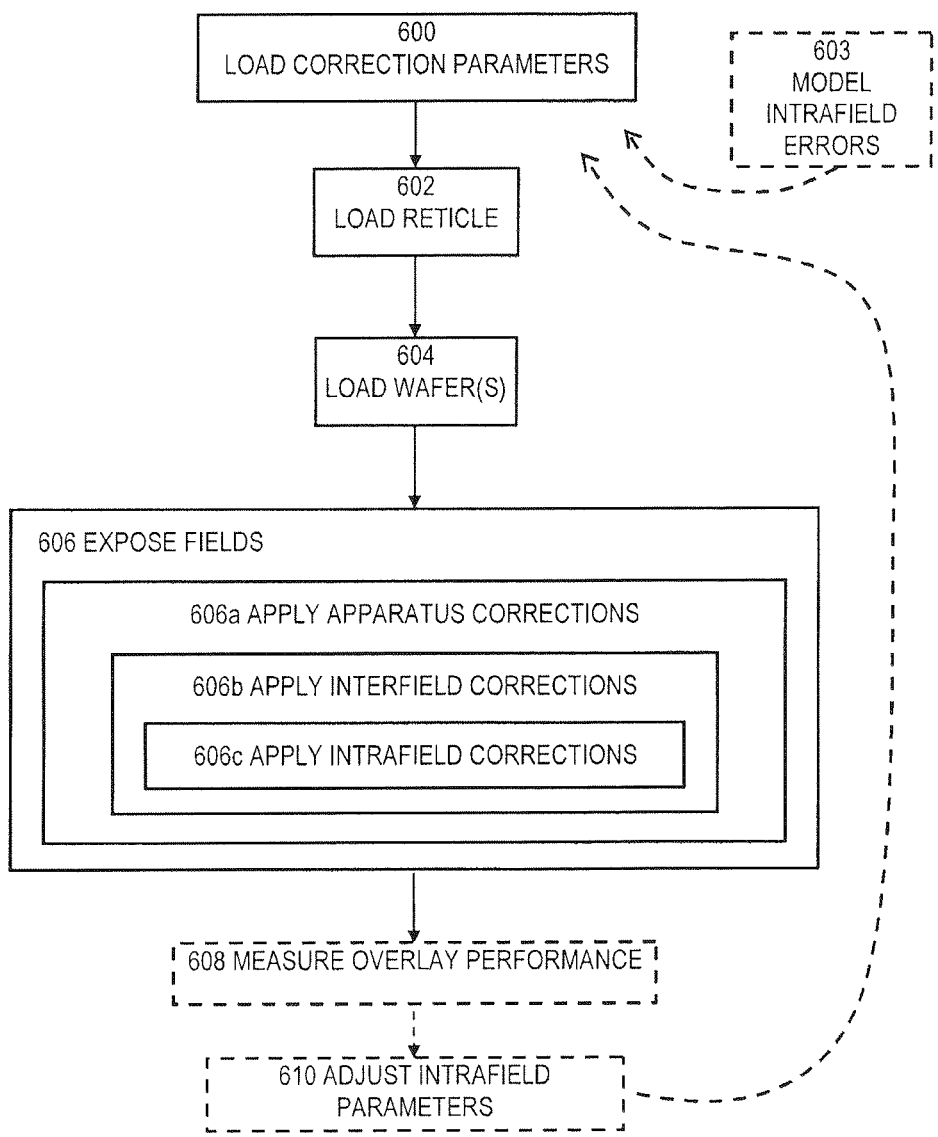
FIG. 6 is a flowchart of a method applying intrafield corrections, according to an embodiment of the present invention.

FIG. 6, according to an embodiment of the present invention, is a flowchart summarizing the method described above. At 600 there are loaded the correction parameters specific to this lithographic apparatus, using whatever calibration measurements and modeling processes are implemented. As an example, the stability modules exploiting the Baseliner™ methodology may be employed. Additionally, however, intrafield correction parameters are included. At 602 a reticle is loaded into the lithographic apparatus. As is well known, this step includes loading many parameters for controlling the patterning process in a manner appropriate to this specific reticle. These parameters are referred to as the 'recipe.' The steps 600, 602 may be performed simultaneously or in a different sequence. Normally, we load the parameters prior to a lot (that is a batch of wafers), or simultaneously when a lot is started. The intrafield correction parameters may be provided for example by modeling (603), and/or by feedback from measurements, as discussed below.

At step 604 a wafer is loaded onto the substrate table WS and measured for alignment. At step 606, the exposure sequence begins. Throughout the process, corrections specific to the apparatus are applied (606*a*). Between fields, corrections are applied in the conventional manner to compensate for interfield variations (606*b*). Within each field, the intrafield corrections are applied (606*c*), for example by control of the reticle stage height and tilt setpoints.

After exposure, overlay performance can be measured over the entire substrate, and interfield and intrafield variations can also be measured, step 608. Optionally, the intrafield errors measured can be used to adjust the intrafield correction parameters for subsequent exposures.

Lithography Apparatus Control Unit LACU

Figure 7:
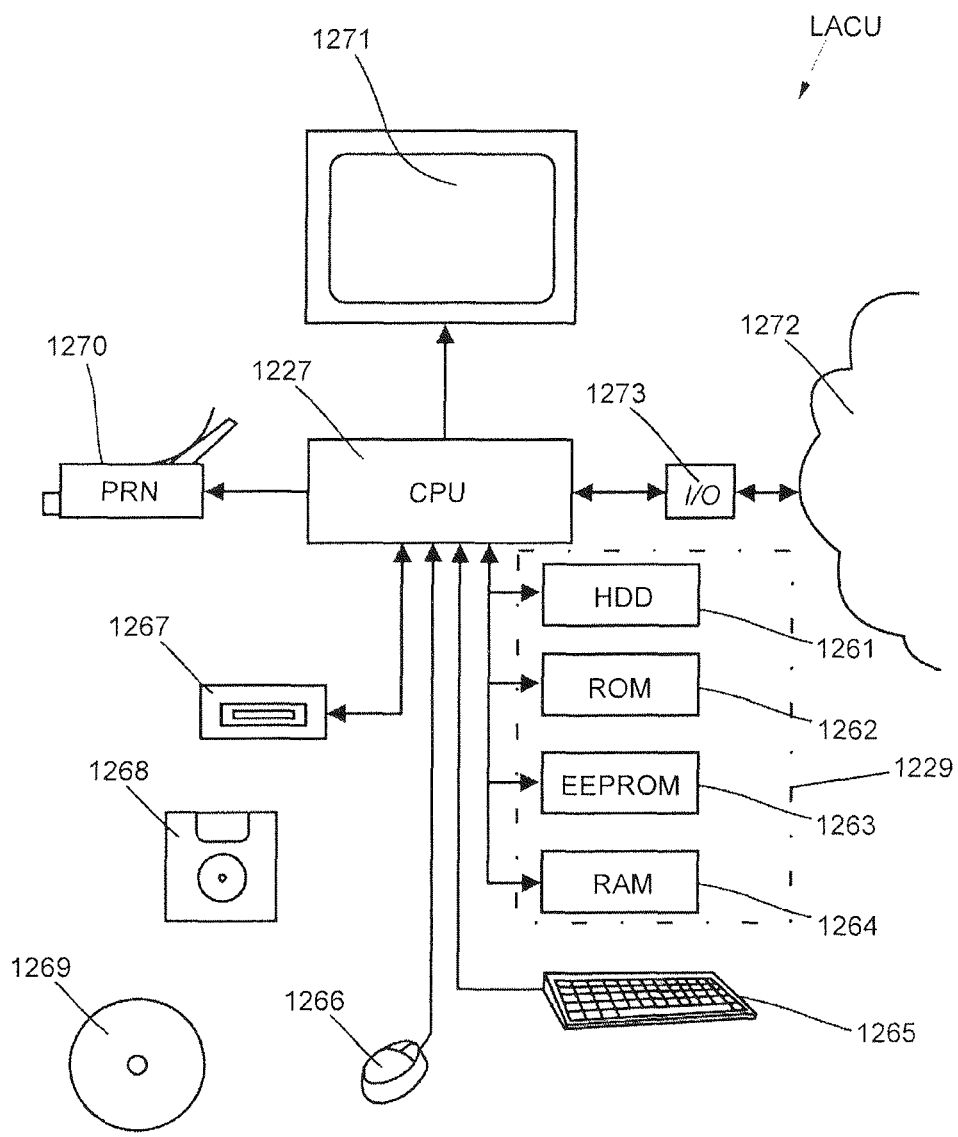
FIG. 7 is a view of a lithographic apparatus control unit controlling the apparatus and method, according to an embodiment of the present invention.

It should be understood that the lithography control unit LACU in the previous embodiments may be based on a computer assembly as shown in FIG. 7, according to an embodiment of the present invention. The computer assembly may be a dedicated computer in the form of a control unit in embodiments of the assembly according to the invention or, alternatively, be a central computer controlling the lithographic apparatus. The computer assembly may be arranged for loading a computer program product comprising computer executable code. This may enable the computer assembly, when the computer program product is downloaded, to implement the novel operations of the lithographic apparatus, in accordance with the methods described above.

Memory 1229 connected to processor 1227 may comprise a number of memory components like a hard disk 1231, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g., in the form of computer executable code, from and under some circumstances store data on a data carrier, like a removable disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Separate processing units external to the lithographic apparatus may be used, for example, for implementing the scanner stability module 500, Advanced Process Control (APC) module 525 and Manufacturing Execution System (MES). These processing units can have the same general architecture as the one illustrated here.

It is observed that, although all connections in the drawing are shown as physical connections, one or more of these connections can be made wireless. They are only intended to show that "connected" units are arranged to communicate with one another in some way. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. Separate program products may be provided, for example, for controlling the injection of probe frequencies and for presenting and analyzing the measurement results.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus, comprising:
an illumination system configured to condition a radiation beam;
a support configured to support a patterning device, the patterning device being configured to impart the radiation beam with a pattern in its cross-section to form a patterned radiation beam;
a substrate table configured to hold a substrate;
a projection system configured to project the patterned radiation beam onto a target portion of the substrate to form a projected image of the pattern; and
a control system configured to dynamically control movements of one or more optical elements within the projection system during a scanning operation,
wherein the scanning operation comprises the patterning device and the substrate being scanned synchronously through the radiation beam to apply the pattern to a desired portion on the substrate, and
wherein the dynamically controlled movements provide corrective variations in one or more properties of the projection system during the scanning operation to compensate for distortion effects that vary in the projected image on the target portion of the substrate during the scanning operation.

2. The apparatus of claim 1, wherein the control system is configured to dynamically control movements of one or more optical elements in the projection system during the scanning operation to vary a magnification property of the projection system in one or more dimensions during the scanning operation.

3. The apparatus of claim 1, wherein the movements of the optical elements are based on modification, by the control system during the scanning operation, of control parameters that determine horizontal distortion in the projection system.

4. The apparatus of claim 1, wherein:
the patterning device, the projection system, and the substrate together as an optical system comprise an optical axis that defines a vertical direction;
the patterning device and substrate are arranged nominally in respective horizontal planes of the optical system;
the control system is further configured to dynamically control movements of one or more elements of the optical system outside the projection system during each scanning operation; and
the dynamically controlled movements include out-of-plane corrective movements to compensate fur intrafield in-plane distortion effects that cannot be corrected by only in-plane movements of the patterning device and substrate support.

5. The apparatus of claim 4, wherein the control system is configured to control at least one of the patterning device support and substrate table during the scanning operation, in order to effect the corrective movements.

6. The apparatus of claim 1, further comprising:
a measuring apparatus configured to measure parameters of patterned substrates; and
a data processing apparatus configured to:
analyze the measured parameters to recognize variations of patterning error within substrate portions that are characteristic of the scanning movement; and
calculate parameters of the corrective variations and optionally the corrective movements.

7. A device manufacturing method comprising:
supporting a patterning device, the patterning device being configured to impart a radiation beam with a pattern in its cross-section to form a patterned radiation beam, wherein an illumination system is configured to condition the radiation beam;
securing a substrate;
projecting the patterned radiation beam onto successive target portions of the substrate to form a projected image of the pattern, wherein each portion of the substrate is patterned by a field scanning operation that comprises:
moving of the substrate table and the patterning device relative to each other and to the projection system, and
scanning of the patterning device through the radiation beam while synchronously scanning the substrate through the patterned radiation beam to apply the pattern to a desired portion on the substrate; and
dynamically controlling movements of one or more optical elements within a projection system during the field scanning operation, wherein the dynamically controlled movements provide corrective variations during the field scanning operation in one or more properties of the projection system to compensate for distortion effects that vary in the projected image on the target portion of the substrate during the field scanning operation.

8. The method of claim 7, wherein the control system is configured to dynamically control movements of one or more optical elements in the projection system during the field scanning operation to vary a magnification property of the projection system in one or more dimensions during the field scanning operation.

9. The method of claim 8, wherein the movements of the optical elements are based on modifying, during the field scanning operation, control parameters that determine horizontal distortion in the projection system.

10. The method claim 7, wherein:
the patterning device, the projection system and the substrate together as an optical system comprise an optical axis that defines a vertical direction;
the patterning device and substrate are arranged nominally in respective horizontal planes of the optical system;
the method further includes dynamically controlling movements of one or more elements of the optical system outside the projection system during each field scanning operation; and
the dynamically controlled movements include out-of-plane corrective movements to correct for intrafield in-plane distortion effects that cannot be corrected by only in-plane movements of the patterning device and substrate support.

11. The method of claim 10, wherein the corrective movements include vertical moves and tilting of one of the patterning device support and the substrate support during the field scanning operation.

12. The method of claim 7, further comprising:
measuring parameters of patterned substrates;
analyzing measured parameters to recognize variations of patterning error within substrate portions that are characteristic of the scanning operation; and
calculating parameters of the corrective variations and optionally the corrective movements.

13. A data processing apparatus configured to implement operations, the operations comprising:
supporting a patterning device, the patterning device being configured to impart a radiation beam with a pattern in its cross-section to form a patterned radiation beam, wherein an illumination system is configured to condition the radiation beam;

securing a substrate;

projecting the patterned radiation beam onto successive target portions of the substrate to form a projected image of the pattern, wherein each portion of the substrate is patterned by a field scanning operation that comprises:

moving of the substrate table and the patterning device relative to each other and to t le projection system, and scanning of the patterning device through the radiation beam while synchronously scanning the substrate through the patterned radiation beam to apply the pattern to a desired portion on the substrate; and dynamically controlling movements of one or more optical elements within a projection system during the field scanning operation, wherein the dynamically controlled movements provide corrective variations during the field scanning operation in one or more properties of the projection system so as to compensate for distortion effects that vary in the projected image on the target portion of the substrate during the scanning operation.

14. A non-transitory computer program product containing one or more sequences of machine-readable instructions for controlling a lithographic apparatus to operate in a device manufacturing method, the instructions comprising:

instructions for supporting a patterning device, the patterning device being configured to impart a radiation beam with a pattern in its cross-section to form a patterned radiation beam, wherein an illumination system is configured to condition the radiation beam;

instructions for securing a substrate; and instructions for projecting the patterned radiation beam onto successive target portions of the substrate to form a projected image of the pattern, wherein each portion of the substrate is patterned by a field scanning operation that comprises:

moving of the substrate table and the patterning device relative to each other and to the projection system, and scanning of the patterning device through the radiation beam while synchronously scanning the substrate through the patterned radiation beam to apply the pattern to a desired portion on the substrate; and instructions for dynamically controlling movements of one or more optical elements within a projection system during the field scanning operation, wherein the dynamically controlled movements provide corrective variations during the field scanning operation in one or more properties of the projection system to compensate for distortion effects that vary in the projected image on the target portion of the substrate during the scanning operation, and wherein the instructions are adapted for controlling the field scanning operation with the corrective variations and optionally the corrective movements.

15. A non-transitory computer program product containing one or more sequences of machine-readable instructions for controlling a computer system to implement data processing, the instructions comprising:

instructions for supporting a patterning device, the patterning device being configured to impart a radiation beam with a pattern in its cross-section to form a patterned radiation beam, wherein an illumination system is configured to condition the radiation beam;

instructions for securing a substrate; and instructions for projecting the patterned radiation beam onto successive target portions of the substrate to form a projected image of the pattern, wherein each portion of the substrate is patterned by a field scanning operation that comprises;

moving of the substrate table and the patterning device relative to each other and to the projection system, and scanning of the patterning device through the radiation beam while synchronously scanning the substrate through the patterned radiation beam to apply the pattern to a desired portion on the substrate; and instructions for dynamically controlling movements of one or more optical elements within a projection system during a field scanning operation, wherein the dynamically controlled movements provide corrective variations during the field scanning operation in one or more properties of the projection system to compensate for distortion effects that vary in the projected image on the target portion of the substrate during the scanning operation.

* * * * *

UNITED STATES PATENT AND TRADEMARK OFFICE
CERTIFICATE OF CORRECTION

PATENT NO. : 8,717,536 B2  
APPLICATION NO. : 13/009250  
DATED : May 6, 2014  
INVENTOR(S) : Menchtchikov et al.

Page 1 of 1

It is certified that error appears in the above-identified patent and that said Letters Patent is hereby corrected as shown below:

In the Claims:

In Claim 4, column 15, line 51, after "compensate" please delete "fur" and insert --for--.
In Claim 13, column 17, line 10, after "and to" please delete "t le" and insert --the--.
In Claim 15, column 18, line 27, after "comprises" please delete ";" and insert --:--.

Signed and Sealed this
Fourteenth Day of October, 2014

Michelle K. Lee
*Deputy Director of the United States Patent and Trademark Office*